(12) United States Patent
Boudry et al.

(10) Patent No.: US 6,470,054 B1
(45) Date of Patent: Oct. 22, 2002

(54) BIDIRECTIONAL TWO-WAY CMOS LINK TAILORED FOR RECEPTION AND TRANSMISSION

(75) Inventors: Jean-Marie Boudry, Beynes (FR); Marcelo Duhalde, Villepreux (FR)

(73) Assignee: Bull S.A., Louveciennes (FR)

( * ) Notice: Subject to any disclaimer, the term of this patent is extended or adjusted under 35 U.S.C. 154(b) by 0 days.

(21) Appl. No.: 09/430,141

(22) Filed: Oct. 29, 1999

(30) Foreign Application Priority Data

Oct. 30, 1998 (FR) .............................. 98 13640

(51) Int. Cl.$^7$ ................................ H04B 3/00
(52) U.S. Cl. ....................................... 375/257
(58) Field of Search ..................... 375/257; 326/30, 326/86, 108, 32, 82, 31, 83

(56) References Cited

U.S. PATENT DOCUMENTS

| | | | | |
|---|---|---|---|---|
| 4,763,021 A | * | 8/1988 | Stickel | 326/32 |
| 5,122,691 A | * | 6/1992 | Balakrishnan | 326/101 |
| 5,514,983 A | | 5/1996 | Yoshino | |
| 5,578,939 A | | 11/1996 | Beers | |
| 5,666,354 A | * | 9/1997 | Cecchi et al. | 330/259 |
| 5,675,584 A | | 10/1997 | Jeong | |
| 5,760,601 A | | 6/1998 | Frankeny | |
| 6,049,221 A | * | 4/2000 | Ishibashi et al. | 326/26 |
| 6,204,683 B1 | * | 3/2001 | Falconer | 326/30 |

FOREIGN PATENT DOCUMENTS

EP           0 620 649 A       10/1994

OTHER PUBLICATIONS

Hyeongho Lee Et Al: "A CMOS Serial Link for Fully Duplexed Data Communication" IEEE Journal of SolidState Circuits, vol. 30, No. 4, Apr. 1, 1995, pp. 353–363 XP000506438; ISSN: 0018–9200, Sections III.B, III.D Figs 5,8,9.

Toshiro Takahashi Et Al: "WP2.5: A CMOS Gate Array with 600 MB/S Simultaneous Bidirectional I/O Circuits" IEEE Int'l. Solid State Circuits Conference, vol. 38, Feb. 1, 1995; pp. 40–41, XP000557545; ISSN: 0193–6530 p. 40, col. 1, line–13—line 13; Fig. 2.

Knight T F Et Al: "A Self Terminating Low Voltage Swing CMOS Output Driver" IEEE Journal Of Solid State Circuits, vol. 23, No. 2 Apr. 1, 1988 pp. 457–464, XP002031275, ISSN: 0018–9200, Section IV.

* cited by examiner

Primary Examiner—Don N. Vo
(74) Attorney, Agent, or Firm—Miles & Stockbridge PC; Edward J. Kondracki

(57) ABSTRACT

The present invention relates to a bidirectional two-way CMOS link of the type including a tailored transmission line (AB) connecting two integrated circuits to its two ends. The integrated circuits respectively including a transceiver that includes a transmitter stage (7; 20) and a receiver stage (10), interfacing with the transmission line (AB) and controlled to transmit or receive digital data exchanged over the transmission line (AB) as a function of a control signal (transmission_gd) to put it in either the transmission mode or the reception mode, the transceivers never being in the same mode at the same time. The link is characterized in that each transceiver includes at least one PMOS transistor (MA), and one (NMOS) transistor (MB), which are controlled respectively by the control signal and are dimensioned and arranged to adapt the link to the two ends of the transmission line (AB). The invention in particular is utilized in tailoring of links that connect processors of a multiprocessor platform.

20 Claims, 11 Drawing Sheets

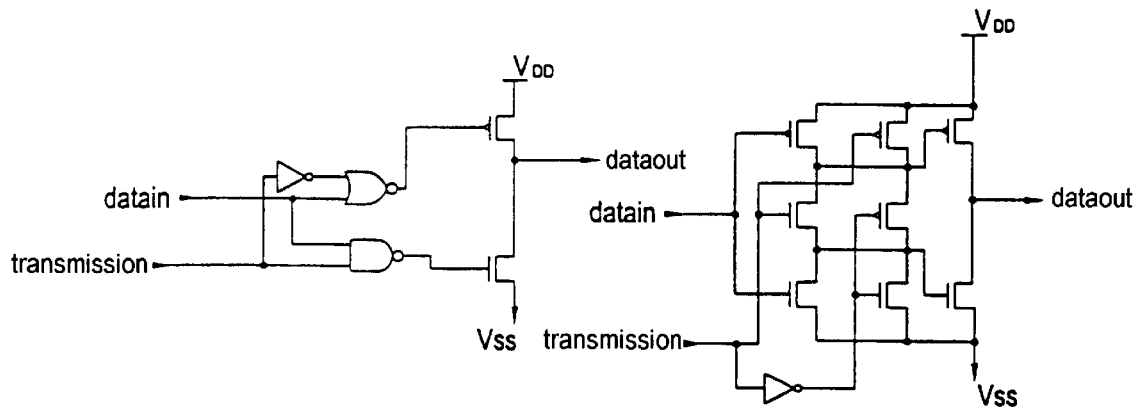
FIG. 3a
FIG. 3b
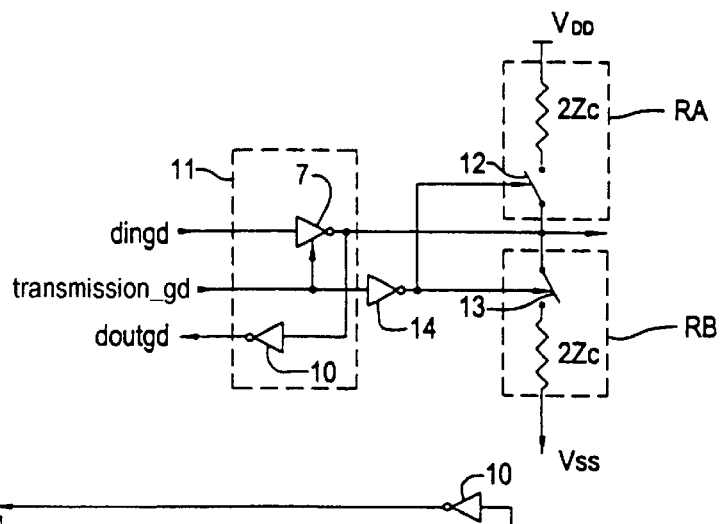
FIG. 4
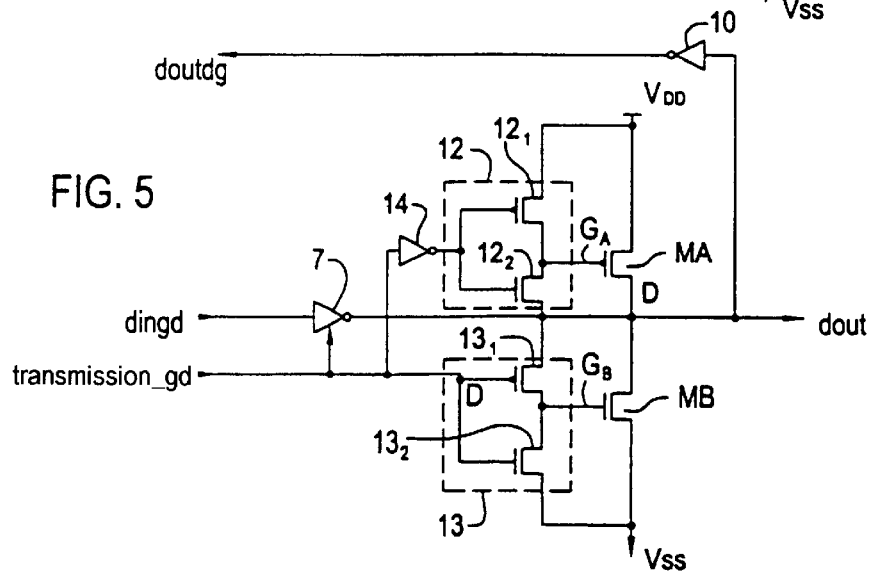
FIG. 5

BIDIRECTIONAL TWO-WAY CMOS LINK TAILORED FOR RECEPTION AND TRANSMISSION

BACKGROUND OF THE INVENTION

1. Field of the Invention

The present invention relates to digital data transmissions exchanged between integrated circuits, using bidirectional two-way CMOS links tailored for reception and transmission.

2. Description of Related Art

As the amount of data exchanged between a very great number of processors increases, links tailored for transmitting these data from one end of the link to the other while guaranteeing their integrity are increasingly needed.

For high outputs, that is, high frequencies, the inductance and the capacitance of the transmission medium must be taken into account; the effects of this medium mean that the variations in potential are propagated in the form of progressive waves along the medium.

The speed of propagation of this wave on a line is a function of the inductance and capacitance of the line, which then define the characteristic impedance of the line.

Any variation in impedance or maladaptation causes a variation in the speed of propagation of the wave, which then breaks down into a transmitted wave and a reflected wave, which can interfere with one another and lead to a partial or total loss of the information exchanged over the line.

To prevent this phenomenon, the line is made to have a structure and hence a characteristic impedance that are constant over its entire length.

However, it is difficult to prevent the phenomena of maladaptation, which are associated particularly with different branches of the line, and especially with the connections of the processors along the line.

In general, a bidirectional transmission requires the presence of a buffer state which is both a transmitter and a receiver, also called a bidirectional buffer, at the level of each processor, the buffer being coupled to the transmission line by an adaptation impedance.

The transmission line, while being so tailored, can still have certain imperfections.

The direction of transmission must be capable of being bidirectional; that is, under the control of a predetermined control signal, each end of the link can be a receiver at some times and a transmitter at others.

One can choose to make bidirectional transmissions simultaneously in both directions or not, but the option of simultaneous transmission requires buffers of extremely delicate design, which are capable of separating the transmitted data from the received data.

A link of the GTL type (for "Gunning Transceiver Logic") that is designed specifically to make multi-way transmissions and thus to be capable of managing two-way bidirectional transmissions. This type of link is defined by the JEDEC standard and is the subject of U.S. Pat. No. 5,023,488, entitled "Drivers and Receivers for Interfacing VLSI CMOS Circuits to Transmission Lines".

However, although this solution is well suited to multi-way transmissions, nevertheless it is hard to use for two-way links. In particular, it has the disadvantage of not using the full capacities of the GTL intended for managing the multi-way links, while also having to manage the disadvantages.

These disadvantages are, in particular, elevated currents and current peaks, a specific power supply, and a reference voltage to be generated and distributed.

Adaptation devices based on high-precision, adjustable-value resistance connector bars disposed outside of packages are also known. These connector bars are relatively bulky on boards or cards, whose already-limited dimensions support an ever-increasing number of processors.

Integrated circuits including one or more conductances adjusted to a set-point value are known. Integrating conductances with the integrated circuit allows great economy in terms of space and reduces the problem of connections.

One such circuit is described in particular in French Patent 2 730 365, and entitled "Circuit intégré avec conductance réglable á partir d'un signal numérique de commanded" and its U.S. Pat. No. 5,652,538 [Integrated circuit with adjustable conductance based on a digital control signal]. This reference describes an integrated circuit that includes at least one conductance that can be adjusted on the basis of a digital set-point signal that encodes value increments for rendering an exact value as discrete with a relatively fixed precision. The conductance comprises elementary conductances that each define one value increment, such that each elementary conductance is dimensioned so that two successive value increments of the digital set-point signal correspond to a single value increment of the conductance. If the first of the two value increments of the digital set-point signal is a value that is less, or greater, than the exact value, then the corresponding elementary conductance is activated or deactivated, respectively. Thus the total adjusted conductance value is equal to the exact value, with the same relative precision, without oscillating between two values on either side of this exact value.

This type of solution requires complex logic for processing a set-point signal that makes it possible to control the conductances used for adaptation of the integrated circuit. This control logic is relatively difficult to use and not insignificantly increases the size of the integrated circuit that receives these adaptation conductances.

SUMMARY OF THE INVENTION

One object of the present invention is to obtain performance equivalent to that obtained with a GTL-type link for transmitting data in the first "outbound leg" of the signals, without waiting for a "round trip" on the line, while having less of an impact on the environment in terms of electrical currents, power supplies, and packaging.

To this end, the first subject of the invention is a bidirectional two-way CMOS link of the type including a tailored transmission line connecting two integrated circuits to its two ends, these integrated circuits respectively including a transceiver that includes a transmitter stage and a receiver stage, interfacing with the line and controlled to transmit or receive digital data exchanged over the transmission line as a function of a control signal to put it in either the transmission mode or the reception mode, the transceivers never being in the same mode at the same time.

According to the invention, the link is characterized in that each transceiver includes at least one NMOS transistor and one PMOS transistor, which are controlled respectively by the control signal and are dimensioned and arranged to adapt the link to the two ends of the transmission line.

In one characteristic, the NMOS and PMOS transistors are dimensioned and arranged to behave like adaptation resistors, in the reception mode.

According to another characteristic, the adaptation resistors have parabolic characteristics, and that their algebraic sum defines a quasi-linear characteristic, whose slope is substantially equal to the characteristic impedance value of the transmission line.

The invention has the advantage in particular of dampening the effects due to the package from the standpoint of the receiver, and of using the transistors of the buffers, implanted in the integrated circuit, to perform the adaptation of the link while reducing the number and size of the MOS transistors.

The invention does not use particular control signals; instead, it uses only the validation signals of the transceivers of the integrated circuits.

Another advantage is that there is no need for external resistors, which makes for a lower cost and thus makes it easier to design the printed card.

This advantage is far from negligible and can even become primary, given the hundreds of links, or even more than a thousand links, based on the same package.

Another advantage of integrated adaptation resistors according to the invention is that if the production variation is such that the PMOS and NMOS transistors have a range of variation that matches a perfectly centered technology, then the direction of variation of the Thévenin voltage generator, which is equivalent to integrated resistors, varies in the same direction as the triggering voltage of the inverter used as an input director. Hence there is at least partial compensation for the variations.

Finally, implanting terminal resistors RT in the integrated circuit provides the best attenuation of the parasitic oscillations induced by the maladaptations caused by the package connectors.

BRIEF DESCRIPTION OF THE DRAWINGS

Further advantages and characteristics of the present invention will become apparent from the ensuing description, in conjunction with the accompanying drawings.

FIGS. 3a and 3b, respectively, show two examples of circuit diagrams for tristate transmitters;

FIG. 4 is a skeleton circuit diagram of a bidirectional buffer in a link according to the invention, with distinct controlled resistors of the transmitter;

FIG. 5 shows the circuit diagram of the buffer of FIG. 4;

DESCRIPTION OF THE PREFERRED EMBODIMENTS

Figure 1:
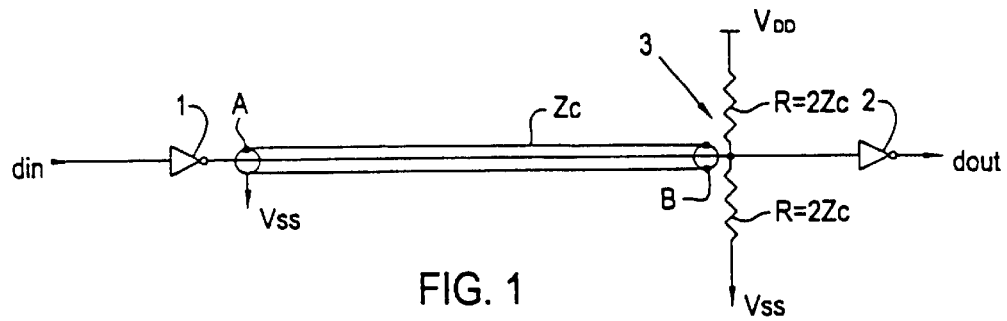
FIG. 1 is a skeleton circuit diagram for a monodirectional CMOS link tailored for transmission and reception.

In the drawings, elements that are same are identified by the same reference numerals.

FIG. 1 schematically illustrates one example of a monodirectional CMOS link for transmission and for reception, tailored at its two ends.

A transmission line AB of predetermined length and with a characteristic impedance ZC is shown; it connects a transmitter 1, connected to its input A, to a receiver 2, connected to its output B. The transmitter 1 and the receiver 2 are each represented by an inverter. A two-resistor bridge 3, with respective resistance values R=2ZC is connected to B output. The bridge 3 is supplied with a high supply voltage VDD and a low supply voltage VSS.

As seen from the receiver 2, the resistor bridge 3 has a Thévenin circuit diagram with equivalent impedance ZC in series with a voltage generator whose value is equal to VDD/2.

Figure 1A:
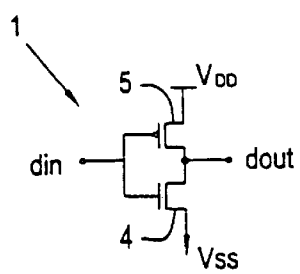
FIG. 1a is a circuit diagram of a transmitter, represented by an inverter in FIG. 1.

FIG. 1a shows the electrical diagram of the transmitter 1, made on the basis of a CMOS made up of an NMOS transistor 4 and an PMOS transistor 5 connected in a known manner.

Figure 1B:
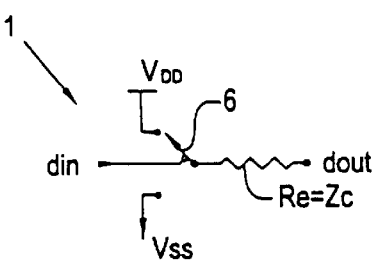
FIG. 1b is the equivalent circuit diagram for the receiver.

FIG. 1b shows the equivalent diagram for the transmitter 1 performing like an inverter 6 that is controlled by a control signal din and furnishing an output signal dout.

If the transistors are correctly dimensioned, that is, if the equivalent resistances of the NMOS transistor 4 and PMOS transistor 5 are identical in value, then the equivalent diagram can be reduced to a resistance RT=ZC, which is switched between VDD and VSS; RT will hereinafter be called the terminal resistance of the equivalent Thévenin diagram for the transmitter or the receiver.

Under these conditions, the amplitude of the signals transmitted equals the value VDD/2, centered on VDD/2, which means that the low level transmitted is equal to VDD/4, and the high level is equal to 3VDD/4.

The coefficient of reflection at an arbitrary end of the line is equal to:

$$Creflex=(RT-ZC)/(RT+ZC) \quad (1)$$

Creflex is between −1 (when the line is connected to a short circuit or to a pure voltage generator, in which case RT=0) and +1 (when the end of the line is out in the open or is connected to a current generator).

Creflex=0, when R=ZC.

The value of the tailoring at the two ends is that the tailoring is not perfect; the terminal resistance is expressed by $$RT=ZC(1+\epsilon R) \quad (2)$$

hence Creflex=$\epsilon R/(2+\epsilon R)$, which is close to $\epsilon R/2$ when $\epsilon R$ is a low percentage.

For example, if the terminal resistance RT is ±20% of the value ZC at each end of the line, then the first reflection has an amplitude of 10% of the first signal transmitted, and the second reflection from the receiver will have an amplitude of 1% of the first signal.

The second reflection mixes with the new signal sent, because one does not wait until a signal has arrived to send the next one. Hence it is important that there be major attenuation of the reflections after an "outbound-return-outbound" trip, to prevent intermodulations of signals. These multiple reflections are seen as noise, for the signals transmitted to the first "outbound leg".

It can thus be seen that the double adaptation, while imperfect, leads to major attenuations of reflections and hence guarantees good integrity of the signals transmitted.

Another effect of tailoring for reception is the attenuation and damping of the oscillating parasitic signals induced by local maladaptations, such as the via-holes of the intermediate connectors and the connectors of the package of the integrated circuits.

When an exact adaptation cannot be assured, it will be better for reception to have RT>ZC, with a coefficient Creflex>0, which increases the amplitude of the signal received, and for transmission to have RT<ZC, which also increases the amplitude of the signal transmitted.

The noise generated by the multiple reflections will in fact be more "tolerable", the higher the levels transmitted.

This tolerance for maladaptation will be referred to here by the abbreviation PNOC, for "preferable nonoptimization criterion".

Figure 2:
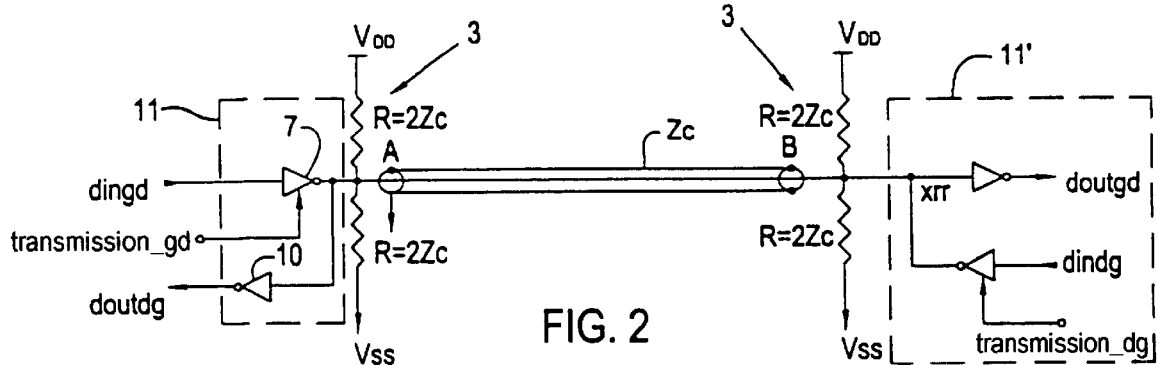
FIG. 2 is a skeleton circuit diagram of a bidirectional link tailored for reception and using fixed resistors.

The diagram in FIG. 2 shows the above link, modified to achieve a bidirectional link, with fixed resistors to preserve the tailoring for reception.

The input/output A and B respectively ends of the line AB are each coupled to the midpoint of a resistor bridge 3 similar to that in FIG. 1.

Figure 2A:
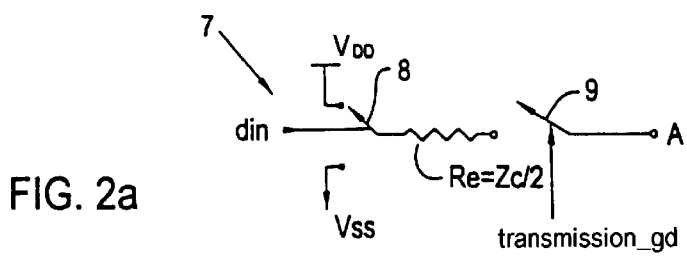
FIG. 2a is the equivalent circuit diagram for the transmitter of the bidirectional link of FIG. 2.

The transmitter used for a bidirectional link is a tristate amplifier 7, whose equivalent diagram is shown in FIG. 2a in its active state, that is, when the first controlled inverter 8 is connected to VDD (or VSS).

To preserve the same amplitude of the signals about VDD/2, the amplifier 7 must have an equivalent resistance Re=ZC/2.

A second switch 9 is shown, in series with the equivalent resistance Re. This second switch 9 is controlled by a validation signal, which in the logic state "1" controls the transmission and in the logic state "0" puts the transmitter in the high-impedance-state; the amplifier 7 is deactivated and can be considered as an open circuit at point A.

For reception, a receiver or reception buffer 10, also shown as an inverter, is coupled to point A and outputs the is signal doutdg sent via the transmission line AB. The tristate amplifier 7 and the receiver 10 constitute a bidirectional transceiver, also called a bidirectional buffer 11, shown outlined by a broken line.

At point B, a bidirectional buffer 11' identical to the buffer 11 is shown symmetrically.

Because of this symmetry, only the bidirectional buffer disposed on the left of the transmission line AB will be shown in the ensuing drawing figures and hence described hereinafter.

FIGS. 3a and 3b, respectively, show two tristate amplifier diagrams, among other possible layouts. A tristate amplifier is necessary in the case of a bidirectional transmission, such as that shown in FIG. 2, and enables the reversal of the direction of transmission.

The amplifier in FIG. 3b uses fewer transistors than that of FIG. 3a (six transistors instead of eight), while retaining the same electrical characteristics.

A first adverse consequence of the configuration of FIG. 2 is that twice the current is consumed, because all the impedances are divided by two.

A second adverse consequence is that, since the line is not tailored on the transmitter side, ZC/2 is parallel to ZC or ZC/3, and the coefficient of reflection is no longer theoretically 0 even if the line is perfectly tailored, but instead is (ZC/3−ZC)/(ZC/3+ZC), or in other words −½, even though the link is not as well protected against multiple reflections, in the case where the line is only approximately tailored.

The idea of the invention is to integrate adaptation resistors with the integrated circuit itself, in the form of MOS transistors capable of being controlled by the control signals that validate transmission or reception, so as to control the implementation or conversely to control turning the adaptation resistors off. Accordingly, the goal is to turn to the circuit diagram of FIG. 1, regardless of the direction of data transfer.

FIG. 4 shows the skeleton diagram of a bidirectional buffer 11, shown outlined by a broken line, of a link according to the invention, for making bidirectional CMOS links that are tailored for both transmission and reception.

The transmitter stage 7 of the bidirectional buffer 11 is a tristate amplifier that receives the data dingd to be transmitted and the transmission control signal transmission_gd.

Controlled resistors RA and RB, each shown outlined by a respective broken line, are connected as interfaces between the transmission line and the bidirectional buffer 11.

The controllable resistors RA and RB must theoretically have the resistance 2ZC and must be validated in phase opposition with the control signal that validates the tristate amplifier. This validation is obtained by the control signal transmission_gd, which acts on the inverters 12 and 13 of the respective controlled resistors RA and RB. The phase opposition pickup is symbolized by an inverter 14 and is coupled to the output of the bidirectional buffer 11.

The function of a bidirectional CMOS buffer in a link according to the invention will now be described with reference to the circuit diagrams of the embodiments shown in FIGS. 5 and 6.

FIG. 5 shows a first embodiment of a bidirectional transmitter of a link according to the invention, which uses N-PMOS and NMOS transistors MA and MB, respectively, which are intended to perform like the resistors RA and RB of the skeleton diagram in FIG. 4.

In this embodiment, the MOS "resistors" RA and RB are entirely distinct from the MOS transistors of the tristate amplifier 7.

The transistor MB is controlled, via a first commutation stage 13 shown outlined by a broken line, by the control signal transmission_gd that validates either the transmission mode or the reception mode, and the transistor MA is controlled, via a second commutation stage 12 shown outlined by a broken line, by the same control signal, inverted.

The controlled switch 12 in FIG. 4 is embodied by PMOS and NMOS transistors $12_1$ and $12_2$ respectively, and the controlled switch 13 is embodied by PMOS and NMOS transistors $13_1$ and $13_2$, respectively. The gate electrodes of transistors $12_1$ and $12_2$ receive the control signal transmission_gd inverted by the inverter 14, and the gate electrodes of transistors $13_1$ and $12_3$ receive the same signal directly, that is, without inversion.

Figure 5A:
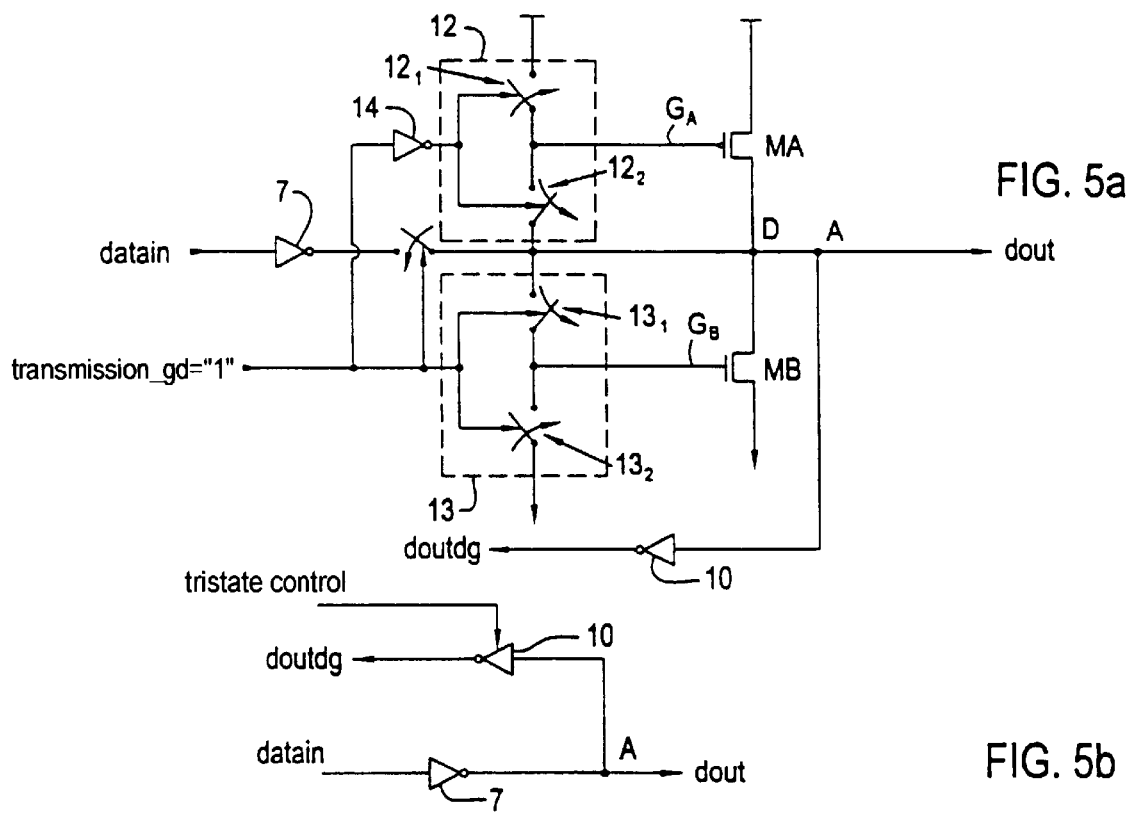
FIG. 5a is the performance diagram of the commutation stages of the buffer in FIG. 4 for transmission.

FIG. 5a schematically illustrates the performance of the transistors $12_1$ $12_2$, $13_1$, $13_2$ in the commutation mode, in the case where the control signal transmission_gd is a logical "1", that is, when it is in the transmission mode.

In the transmission mode, the transistors $12_1$ and $13_2$ behave like closed switches, and the transistors $12_2$ and $13_1$ behave like open switches. The gate electrode of the transistor Ma then receives a logical "1", and the gate electrode of the transistor MB receives a logical "0", which causes the disconnection of the "resistors" MA and MB from the transmission line AB.

The first commutation stage 13, shown outlined by a broken line, behaves like two complementary switches $13_1$ and $13_2$ in series with one another and with the low supply potential VSS and the output of the tristate amplifier 7.

The common point of the two switches $13_1$ and $13_2$ is coupled to the gate electrode GB of the transistor MB, and connects the gate electrode GB to either the low supply potential VSS for transmission, in which case the transistor MB is off, or to the point A (drain of the transistor MB), in which case the transistor MB behaves like a resistor RB.

The second commutation stage 12, shown outlined by a broken line, behaves like two complementary switches $12_1$ and $12_2$ in series with one another and with the high supply potential VDD and the output of the tristate amplifier 7.

The common point of the two switches $12_1$ and $12_2$ is coupled to the gate electrode GA of the transistor MA, and connects the gate electrode GA to either the high supply potential VDD for transmission, in which case the transistor MA is off, or to the point A (drain of the transistor MA), in which case the transistor MA behaves like a resistor RA.

Figure 5B:
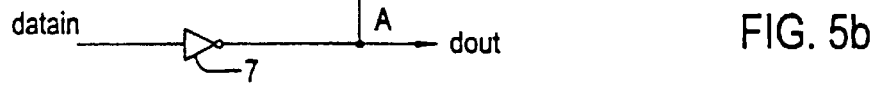
FIG. 5b is the equivalent diagram for the buffer of FIG. 4 for transmission.

The equivalent circuit diagram of the bidirectional buffer for transmission is thus reduced to the diagram in FIG. 5b and includes the transmission buffer 7, which is active, and the reception buffer 10, which is in this case a tristate amplifier controlled to be in the high-impedance state; the output of the transmission buffer 7 and the input of the reception buffer 10 are each connected to the end A of the transmission line AB, not shown.

Figure 5C:
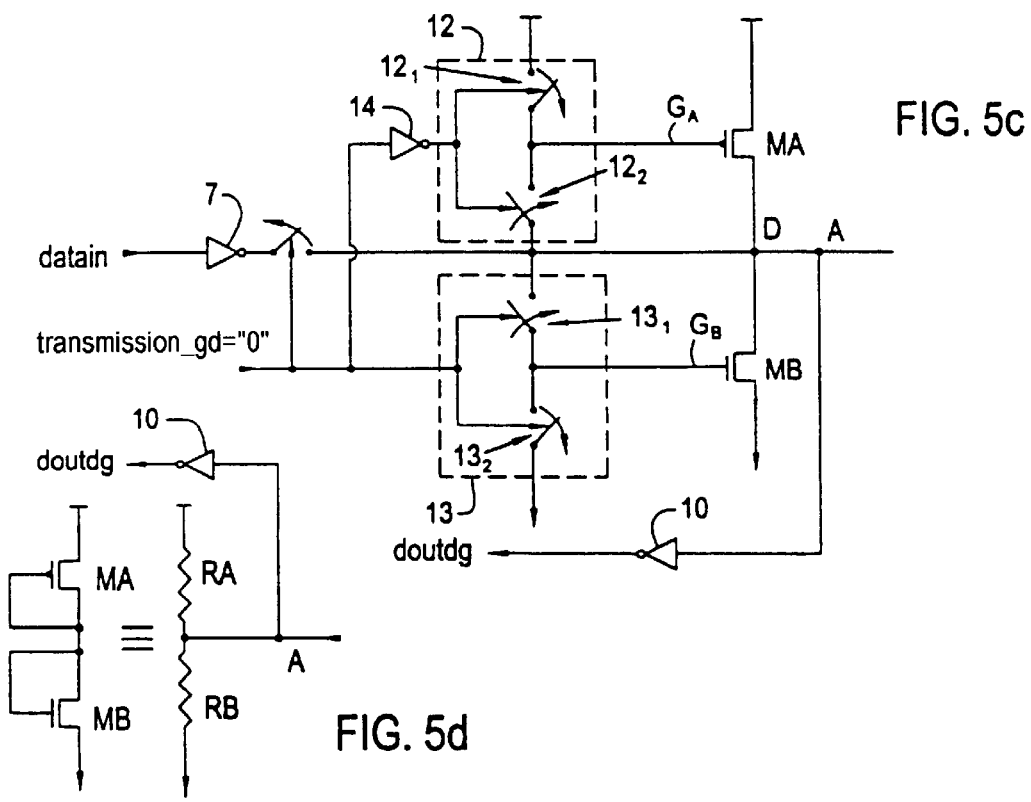
FIG. 5c is the performance diagram of the commutation stages of the buffer of FIG. 4 for reception.

FIG. 5c shows the performance of these same transistors when the control signal transmission_gd is a logical "0", that is, when it is in the reception mode.

In the reception mode, the transistors $12_1$ and $13_2$ behave like open switches, and the transistors $12_2$ and $13_1$ behave like closed switches. The gate electrodes GA and GB of the transistors MA and MB are now connected directly to the transmission line AB, not shown, and the transistors MA and MB now behave like resistors having a resistance 2ZC, thus constituting adaptation resistors in the transmission line AB.

Since the control signal of the tristate amplifier 7 is at the logical "0" level for reception, the tristate transmitter is in the high-impedance state and is no longer active in the equivalent circuit diagram of the bidirectional buffer according to the invention, for the reception mode.

Figure 5D:
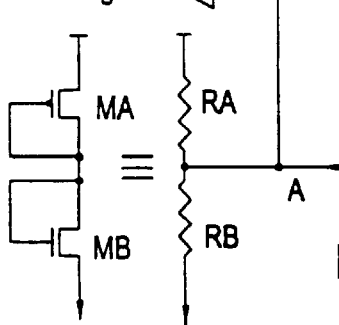
FIG. 5d is the equivalent diagram for the buffer of FIG. 4 for reception.

The circuit diagram of FIG. 5c is thus reduced to the diagram of FIG. 5d; it includes the reception buffer 14, which is active, and the adaptation resistors, which correspond to the respective transistors MA and MB and are connected to point A of the transmission line AB.

Figure 6:
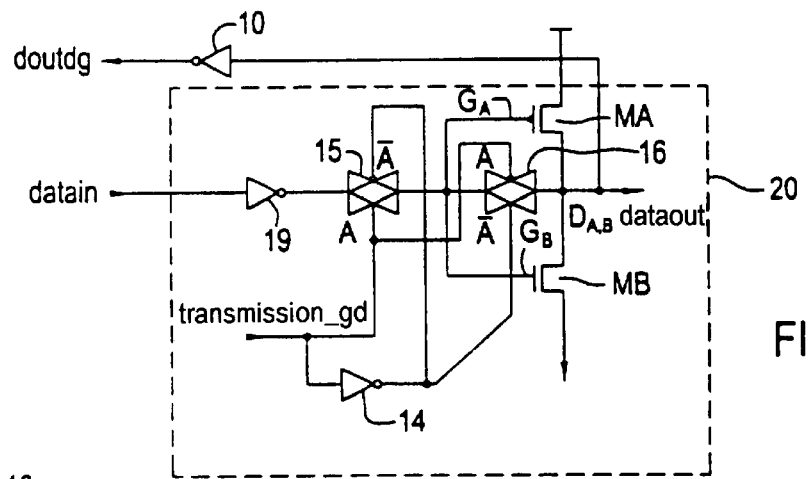
FIG. 6 is a circuit diagram of a buffer in a link according to the invention with controlled resistors that are merged with the transmitter.

FIG. 6 shows a second embodiment of a bidirectional buffer, in which the same transistors MA and MB are used both for transmission and as adaptation resistors for reception.

Figure 10:
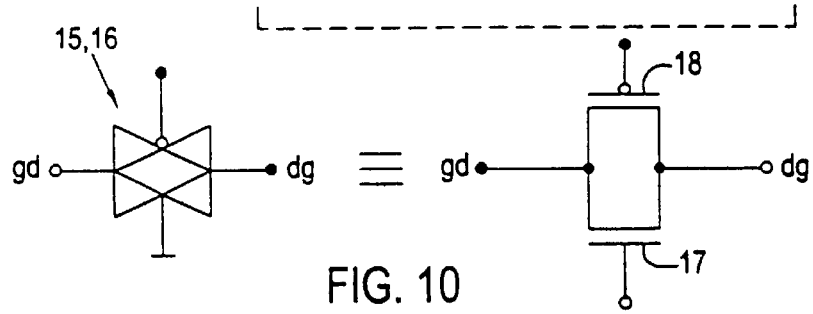
FIG. 10 is the electrical diagram of the commutation stages of the buffer in FIG. 6.

In this embodiment, two CMOS commutation stages 15 and 16 are used, whose equivalent circuit diagram is shown in FIG. 10.

The commutation stages 15 and 16 each include one NMOS transistor 17 and one PMOS transistor 18, which are connected in parallel as shown in FIG. 10. The gate electrodes of the transistors 17 and 18 receive the control signal and the complementary control signal, respectively, and the input/output terminals of the data correspond to the respective common points gd and gd of the two transistors 17 and 18.

If a positive voltage is applied to the terminal gd and a negative voltage is applied to the terminal dg of the commutation stage 15 or 16, then the source of the transistor 17 will be toward the terminal dg.

This kind of circuit wiring makes it possible to optimize the conduction or non conduction of the NMOS transistor 17 and PMOS transistor 18 in the two directions of current flow through the switch 15 or 16. The result attained is a nearly perfect switch. It is also necessary that the control signals arriving at the gate electrodes of the respective NMOS and PMOS transistors 17 and 18 be in phase opposition.

The transmitter stage includes the following elements: an amplifier 19, which receives the data datain to be emitted; a first commutation stage 15, connected in series to the output of the amplifier 19 and controlled by the control signal transmission_gd; and a second commutation stage 16, connected in series to the output of the first commutation stage 15, and controlled by the same control signal, inverted.

The transistors MA and MB are connected to the output of the commutation stages 15 and 16 and to the input of the receiver stage 10; the gate electrodes GA and GB of the transistors MA and MB are shared and are coupled on the one hand to the output of the amplifier 19 via the first commutation stage 16 and on the other to the drains DA,B of the transistors MA and MB via the second commutation stage 16.

The first and second commutation stages 15 and 16 behave like complementary switches, which in the transmission mode connect the gate electrodes GA and Gb to the output of the amplifier 19 and disconnected the gate electrodes from the drains. The transistors MA and MB thus behave like a CMOS amplifier.

In the reception mode, the switches 15 and 16 connect the drains to the gate electrodes and disconnect the gate electrodes from the output of the amplifier 19. The transistors then behave like the resistors RA and RB.

The assembly comprising the amplifier 19, the commutation stages 15 and 16, the inverter 14, and the transistors MA and MB defines a transmitter stage 20 of a link according to the invention. This transmitter stage 20 is shown outlined by a broken line.

Figure 6A:
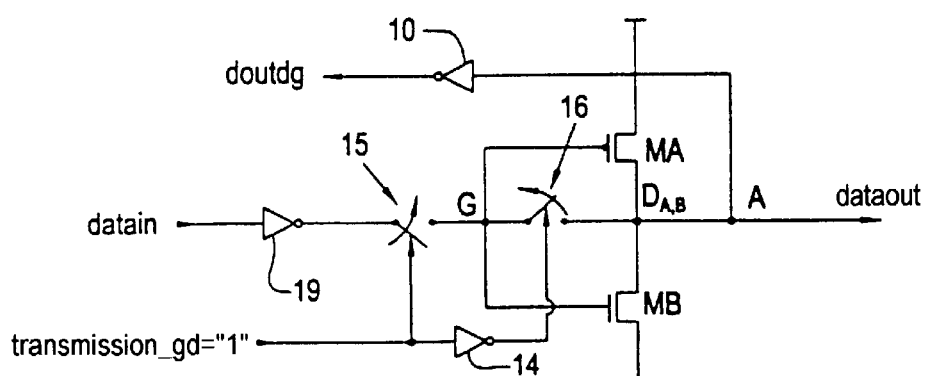
FIG. 6a is the performance diagram of the commutation stages of the buffer in FIG. 6 for transmission.

FIG. 6a schematically shows the behavior of the CMOS switches 15 and 16 in the case where the control signal transmission_gd=logical "1", or in other words in the transmission mode.

In transmission, the NMOS transistor of the first switch 15 receives a logical "1" at its gate electrode, and the PMOS transistor of the second switch 16 also receives a logical "1" at its gate electrode, and quasi-simultaneously, the PMOS transistor of the first switch 15 receives a logical "0" at its gate electrode, and the PMOS transistor of the second switch 16 also receives a logical "0" at its gate electrode.

Figure 6B:
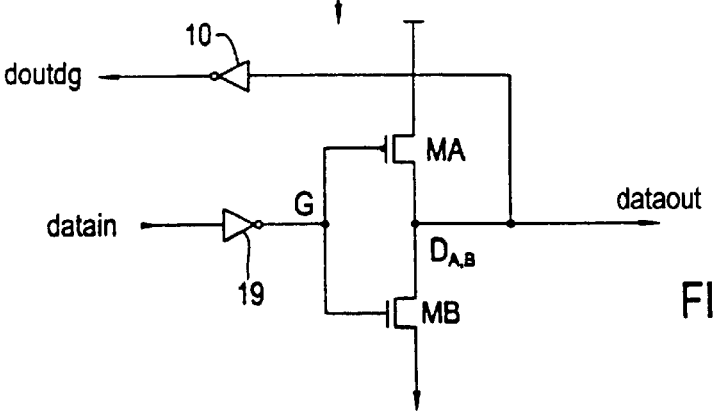
FIG. 6b is the equivalent diagram for the buffer of FIG. 6 for transmission.

The diagram in FIG. 6b is the equivalent circuit diagram obtained for transmission, that is, when the first switch 15 is closed and the second switch 16 is open. The transistors MA and MB are connected as transmitters in series with the transmitter buffer 19 that receives the data datain.

Figure 6C:
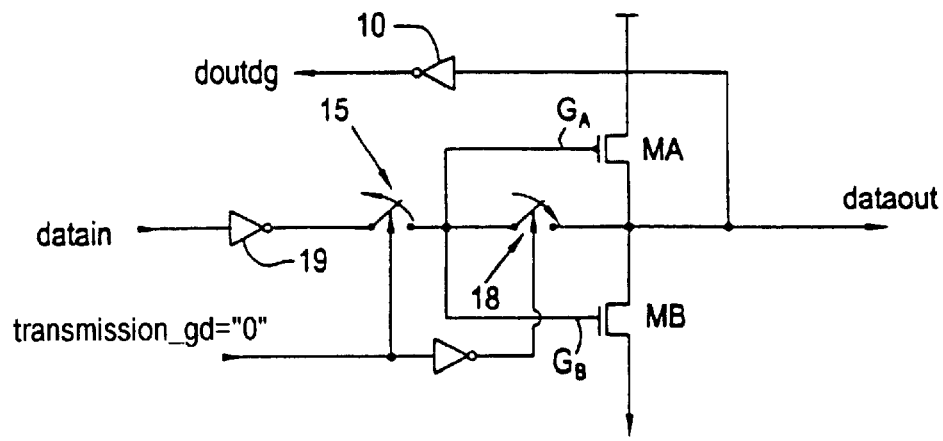
FIG. 6c is the performance diagram of the commutation stages of the buffer of FIG. 6 for reception.

FIG. 6c schematically shows the behavior of the CMOS switches 15 and 16 in the case where the control signal transmission_gd=logical "0", or in other words in the reception mode.

The NMOS transistor of the first switch 15 receives a logical "0" at its gate electrode, and the PMOS transistor of the second switch 16 also receives a logical "0" at its gate electrode, and quasi-simultaneously, the PMOS transistor of the first switch 15 receives a logical "1" at its gate electrode, and the PMOS transistor of the second switch 16 also receives a logical "1" at its gate electrode.

Figure 6D:
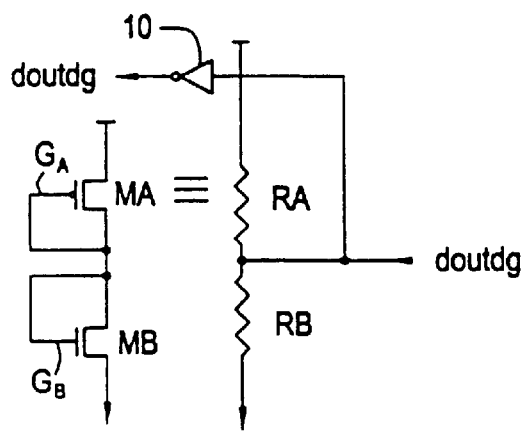
FIG. 6d is the equivalent diagram for the buffer of FIG. 6 for reception.

The diagram in FIG. 6d is the equivalent circuit diagram obtained for reception, that is, when the first switch 15 is open and the second switch 16 is closed. The transistors MA and MB behave like adaptation resistors RA and RB at the end of the transmission line that receives the data doutdg, at the input to the reception buffer 10.

The polarization conditions differ in transmission and reception, depending on the logical state "1" or "0" of the inputs/outputs. In transmission, the polarization voltages of the gate electrodes GA and GB of the transistors MA and MB are equal to VDD or VSS. In reception, the polarization of the gate electrodes of the transistors is equal to 3VDD/4 or VDD/4.

The resistance of the resistors will then be slightly higher for reception than for transmission.

The partially parallel connection of the effective resistors of the NMOS and PMOS transistors must be taken into account and has a tendency to act in the opposite direction, because the NMOS transistor is especially effective at a high level, and the PMOS transistor is especially effective at a low level. However, because this effect is not very sensitive, all the considerations described above mean that the PNOC criterion, as defined above, will automatically be met.

In this embodiment, the transistors MA and MB are used as adaptation resistors and they also participate in the transmission of the signal datain, which makes it possible to use fewer transistors than in the first embodiment, shown in FIG. 5, and to choose "small" transistors, in terms of size, as the transmitter buffer 19. This embodiment thus has an additional advantage in terms of space, compared with the first embodiment in which the tristate transmitter buffer 7 participates only in the transmission itself, and the transistors MA and MB are active only in the reception mode.

Figure 7:
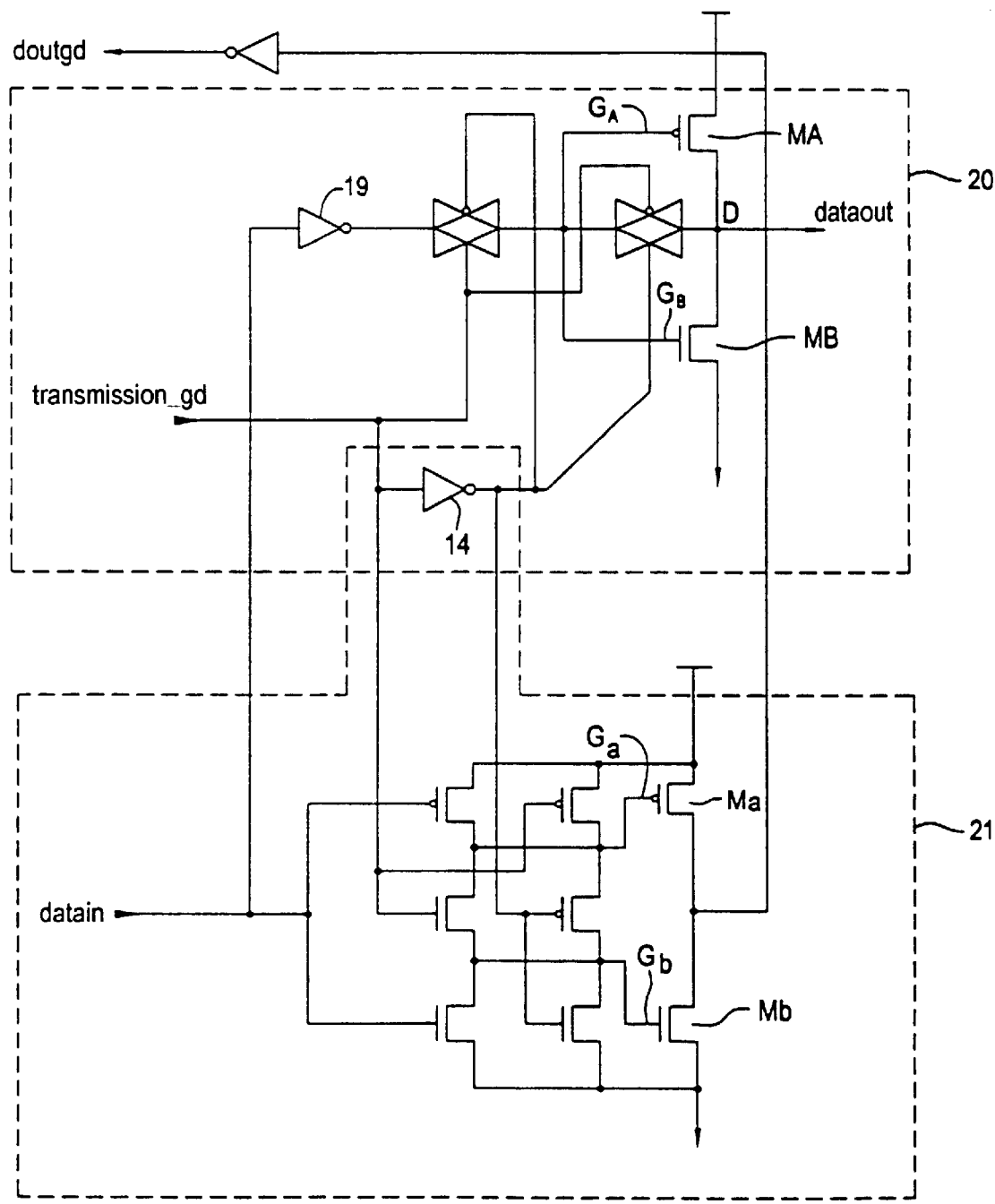
FIG. 7 is a skeleton circuit diagram of a mixed transmitter with lower resistance in transmission than its reception resistance.

FIG. 7 shows a first variant of the bidirectional buffer of a link according to the invention, in which its equivalent resistance in transmission can be made weaker, regardless of its equivalent resistance in reception.

In this first variant, the bidirectional buffer includes a first main transmitter stage 20, corresponding to the transmitter stage shown in FIG. 6, and a second stage 21, corresponding to the tristate transmitter shown in FIG. 3b. These two stages 20 and 21 are each shown outlined by a respective broken line.

The second stage 21 is connected in parallel with the first stage 20 between the input, which receives the data datain, and the output, which furnishes the data dataout. They share the inverter 14 and at their respective inputs they receive the control signal transmission_gd and the data datain to be transmitted.

In the case where a 10% to 20% adjustment in the equivalent resistance is necessary, only the transistors MA and MB are "large" in terms of size; the transistors Ma and Mb serve precisely to provide a conductance complement, that preserves a relatively modestly proportioned size; i.e., a relatively small overall size.

In transmission, the transistors MA and Ma are simultaneously conducting, and their equivalent resistors are connected in parallel. Since the size of the transistor Ma has been reduced more than that of the transistor MA, its equivalent resistance is thus greater than that of the transistor MA, so as to make the 10% to 20% correction noted above. The parallel connection has the effect of reducing the equivalent global resistance.

Figure 8:
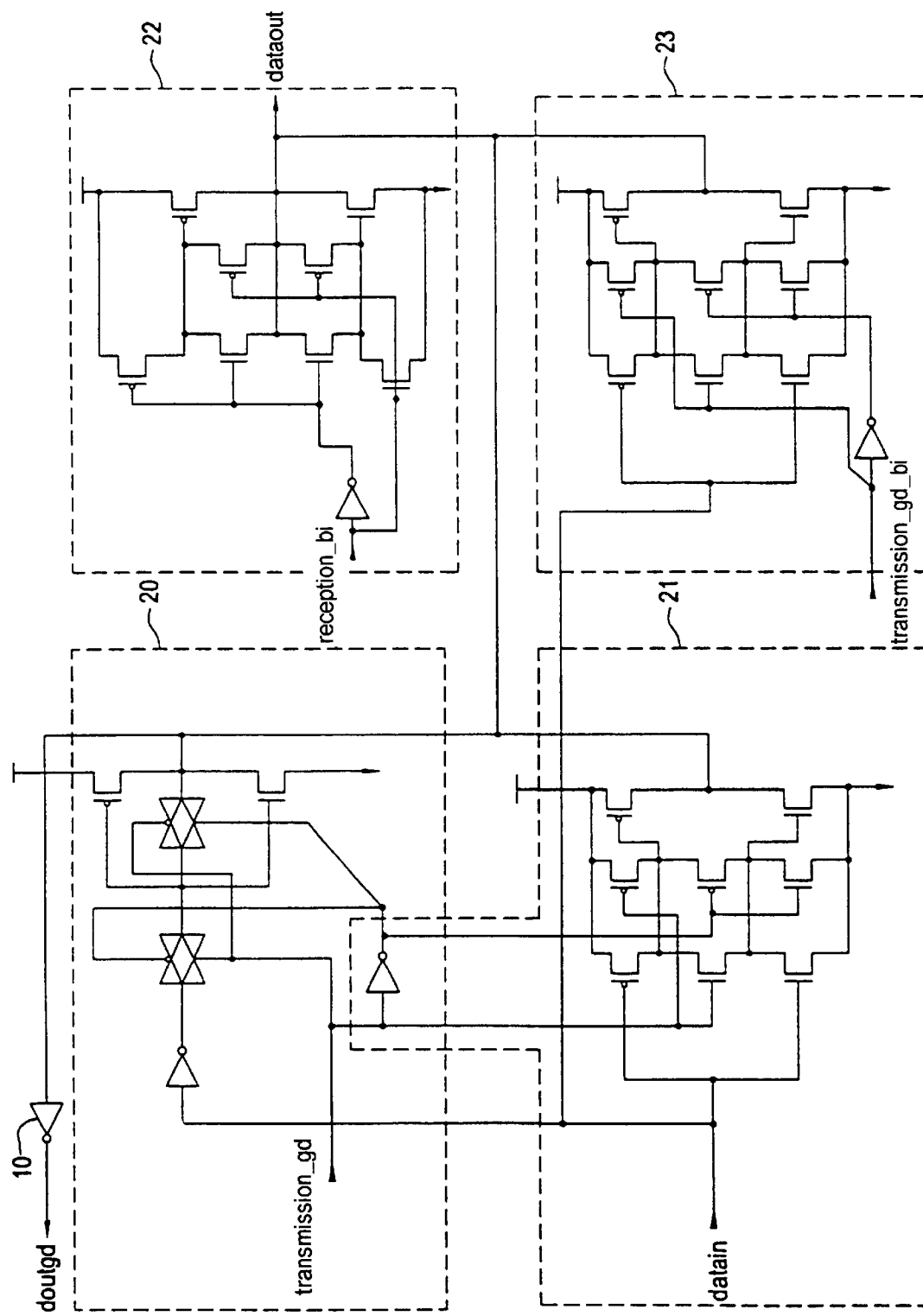
FIG. 8 is a skeleton circuit diagram of a mixed transmitter with lower resistance in transmission than its reception resistance with adjustment of impedance independently of transmission and reception.

FIG. 8 shows a second variant of a bidirectional buffer of a link according to the invention, which allows an additional adjustment, independently of reception and transmission, for instance for correcting excessive production variations.

A third stage 22 and a fourth stage 23 are added to the stages 20 and 21 of the first variant. The stages 20, 21, 22 and 23 are each shown outlined by a respective broken line.

The third stage 22 is a receiver stage, coupled to the output offstage 20 and controlled at its input by a reception control signal reception_bi, and including MOS transistors arranged and dimensioned so as to furnish a conductance complement for reception independently of transmission. Its output is coupled to the common output of the other three states 20, 21 and 22 relating to transmission.

In this stage 22, and in accordance with behavior already described above, the function of two switches is performed, which in the reception mode are in the conducting state and convert the output NMOS and PMOS transistors into adaptation resistors.

Two other switches, which in the transmission mode are in the blocking state, connect the gate electrodes of the output NMOS and PMOS transistors to VSS and VDD, respectively, thus putting them in the high-impedance mode.

The fourth stage 23, corresponding to a third transmitter stage, is connected in parallel with the first and second stages 20 and 21. At a first data input datain and a second input, it receives a second control signal transmission_gd_ bi, and it includes MOS transistors arranged and dimensioned so as to refine the adjustment of the equivalent resistance in transmission. The circuit diagram of the module 23 corresponds to that of the tristate transistor of FIG. 3b.

If only stages 20 and 22 are used, then a bidirectional buffer can be achieved that has the same equivalent transmission and reception resistances, because the stage 22 furnishes the complement of the conductance that is missing for reception.

Parallel multiplication of the stages 22 and 23 increases the number of adjustment options. These adjustments are implemented by putting the various control signals reception_bi and/or émission_gd_bi as a function of the adjustments desired in the reception or transmission mode.

Figure 9:
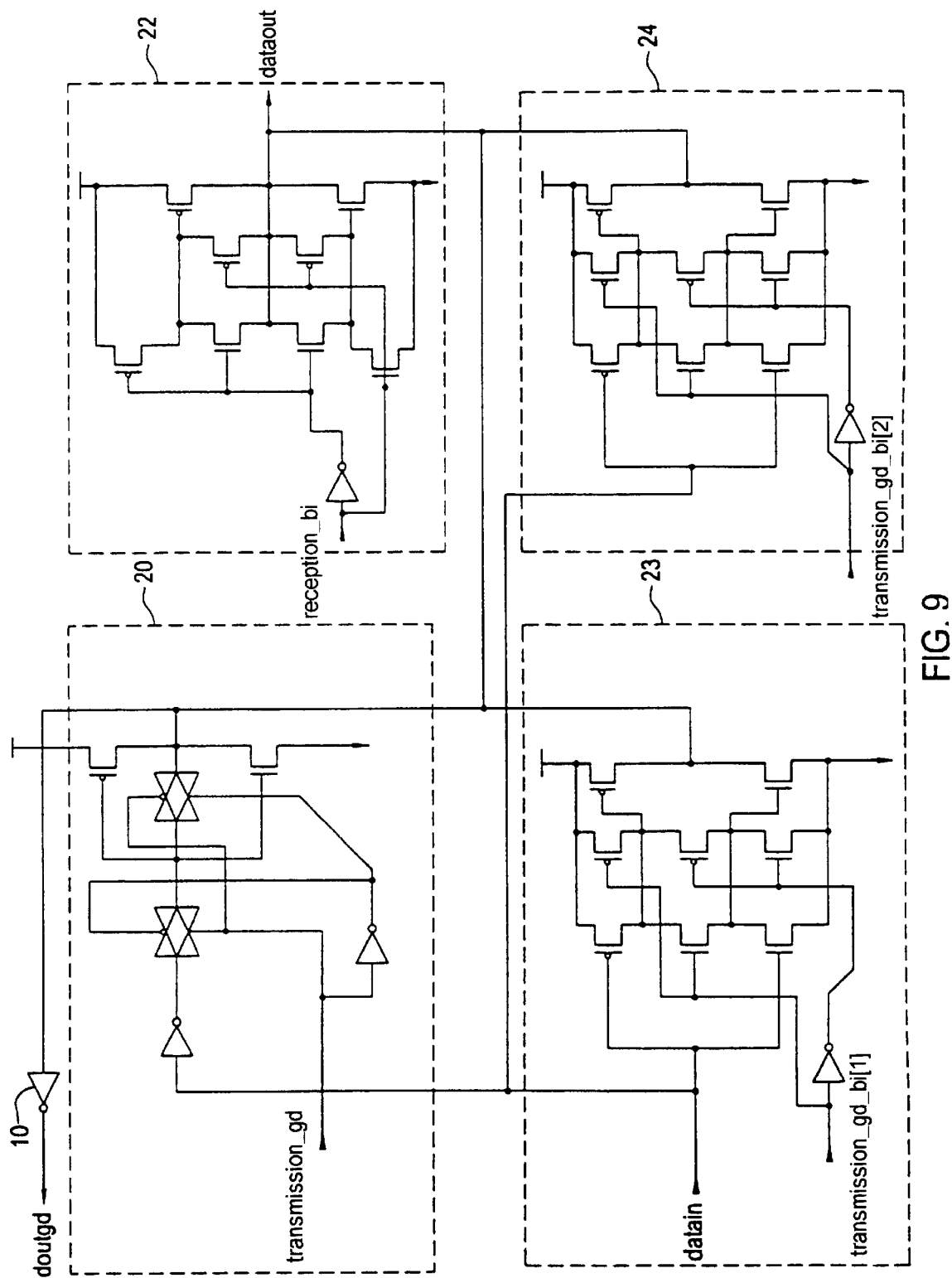
FIG. 9 is a skeleton circuit diagram of a mixed transmitter with lower resistance in transmission than its reception resistance with adjustments of impedance independently of transmission and reception.

FIG. 9 shows a third variant of a bidirectional buffer in a link according to the invention. 2t In this third variant, the stages 23 and 24, which are similar in architecture, receive a control signal émission_bi[2] and émission_bi[1], respectively, which are distinct from the control signal transmission_gd of the first stage 20. The stages 20, 22, 23, and 24 are each shown outlined by a broken line.

The second transmitter stage 23 and the third transmitter stage 24 are each connected in parallel to the first transmitter stage 20, and at their first inputs they each receive the data datain to be transmitted, and at their second inputs they receive, respectively the second transmission control signal émission_gd_bi[1] and the third transmission control signal transmission_gd_bi[2].

They each include MOS transistors arranged and dimensioned for refining the adjustment of the equivalent resistance in transmission independently of reception.

As a function of the production variations among batches of MOS transistors and of the maladaptations that verify the PNOC criterion defined above, ranges of resistance values for the adaptation resistors in transmission and reception can be defined.

Manufacturers of integrated circuits or chips guarantee characteristics that come within what is called a good-function range, bounded by an upper limit and a lower limit.

The upper limit corresponds to the highest currents that are produced, and hence to the fastest chips. This chips are then assigned to a technological class BC, for "best case".

The lower limit corresponds to the lowest currents that are produced, and thus to the slowest chips. These chips are then assigned to a technological class WC, for "worst case".

Equivalent reception resistances equal to 2ZC are preferably provided, so as to have an equivalent Thévenin resistance equal to ZC, for category BC.

In general, an equivalent reception resistance will then be greater than ZC.

Equivalent transmission resistances equal to ZC are also preferably provided, for category WC.

In general, an equivalent transmission resistance will then be less than ZC.

With the ranges of values defined above for the equivalent resistance in transmission and reception, the PNOC criterion defined above is always verified.

Among the following four combinations:

a) transmitter WC and receiver BC b) transmitter BC and receiver BC c) transmitter WC and receiver WC d) transmitter BC and receiver WC, the three combinations a), b) and c) yield a reflection rate that equals 0 after the signals have made a round trip over the line, and an amplitude of the signals transmitted that is greater than or equal to VDD/2.

In case a), the amplitude of the signals transmitted is equal to VDD/2. This is the lowest amplitude among the four cases, but the two reflection coefficients are nil and the best protection against noise is thus obtained.

In case b), the amplitude of the signals in transmission is expressed by the following formula:

$$V_{amplitude} = V_{DD} \frac{Z_C}{R_T + Z_C} \quad (3)$$

where RT<ZC, and hence Vamplitude>VDD/2.

The reflection coefficient on the receiving side is then nil.

In case c), formula (1) is applied to reception:

$$Creflex = (RT-ZC)/(RT+ZC) \quad (4)$$

where RT>ZC, which gives a total amplitude of $$VDD/2(1+Creflex)>VDD/2. \quad (5)$$

The reflection coefficient on the transmission side is then nil.

In case d), the combination of transmitter BC and receiver WC leads to a certain non-zero rate of round trip reflection of signals, but in this case the signal amplitude is the highest of all the combinations (>VDD/2) and is thus the one most capable of handling a certain reflection rate.

This centering of values from the time of conception can prevent any later technological adjustment, if the production variations guaranteed by the manufactures are not excessive.

An example of dimensioning, using 0.25-micron technology, of a bidirectional CMOS buffer with adaptation resistance incorporated into the integrated circuit, in accordance with the invention in terms of the second embodiment shown in FIG. 7, for acting on a 50-ohm line will now be described.

The physical size of a transistor is generally defined by the length of its gate electrode, which must be as small as possible in order to limit the path of the current through the transistor, and by the width of its source X, expressed as an integral number in terms of a unit of length called a "lambda".

This unit corresponds to a physical reality associated with engraving technology and in fact represents a minimal size that can be engraved on silicon. In the example here, lambda=0.25 μm.

By way of example, a simulation yields the following results:

Let WA and WB be the respective lengths of the transistors MA and MB, and let Wa and Wb be the respective widths of the transistors Ma and Mb; then WA=244 lambdas, WB=103 lambdas, Wa=79 lambdas, and Wb=27 lambdas.

Hence the transistors Ma and Mb are "small", compared with the transistors MA and MB.

In transmission, the control signal transmission_gd= VDD; the equivalent PMOS transistor size is WP=WB+Wb, and the equivalent NMOS transistor size is WN=WA+Wa.

In reception, the control signal transmission_gd=VSS; the equivalent PMOS transistor size is WP=WB, and the equivalent NMOS transistor size is WN=WA.

Hence in transmission the terminal resistance is RT<ZC, and in reception the terminal resistance is RT>ZC.

FIGS. 11–14, in the form of voltage curves as a function of the propagation time, show the results of simulations, performed on the basis of the aforementioned dimensioning, for the transmission of a pulse train in a real situation, that is, taking into account the imperfections in the transmission line.

These imperfections are due in particular to the wiring of the chips in their packages, the internal wiring of the packages, and the soldering of the packages onto the printed circuit, which causes changes in impedance.

In these curves, the signal received at the input of the receiver after transmission over the line is shown in solid lines, and the output signal of the transmitter is shown in dotted lines. The input signal of the transmitter is not shown.

Figure 11:
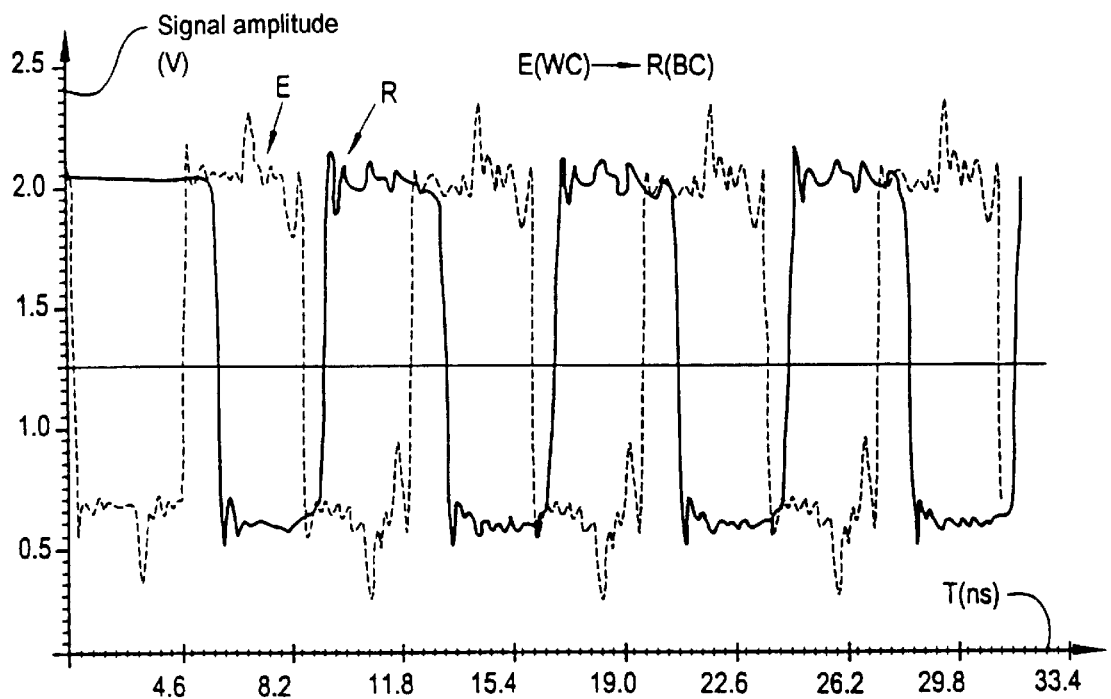
FIG. 11 shows the response of a buffer in FIG. 7, configured as a transmitter WC and a receiver BC, to a pulse train in reality.

FIG. 11 illustrates case a) where the transmitter is WC and the receiver is BC.

Figure 12:
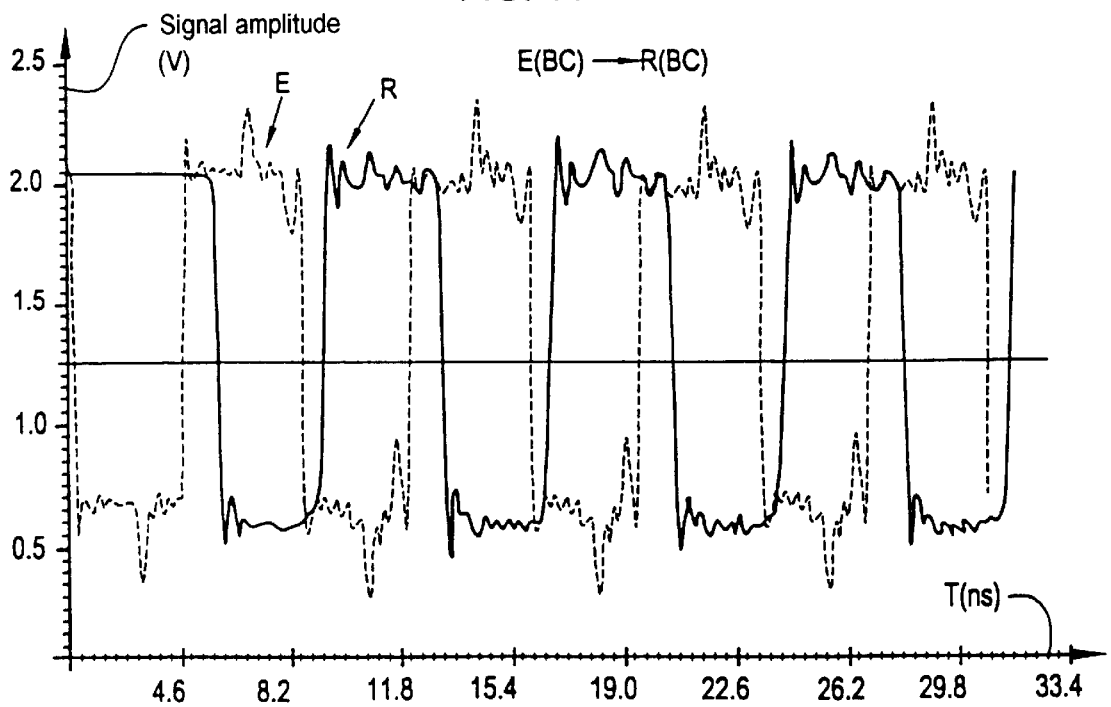
FIG. 12 shows the response of a buffer in FIG. 7, configured as a transmitter BC and a receiver BC, to a pulse train in a reality.

FIG. 12 illustrates case b) where the transmitter is BC and the receiver is BC.

Figure 13:
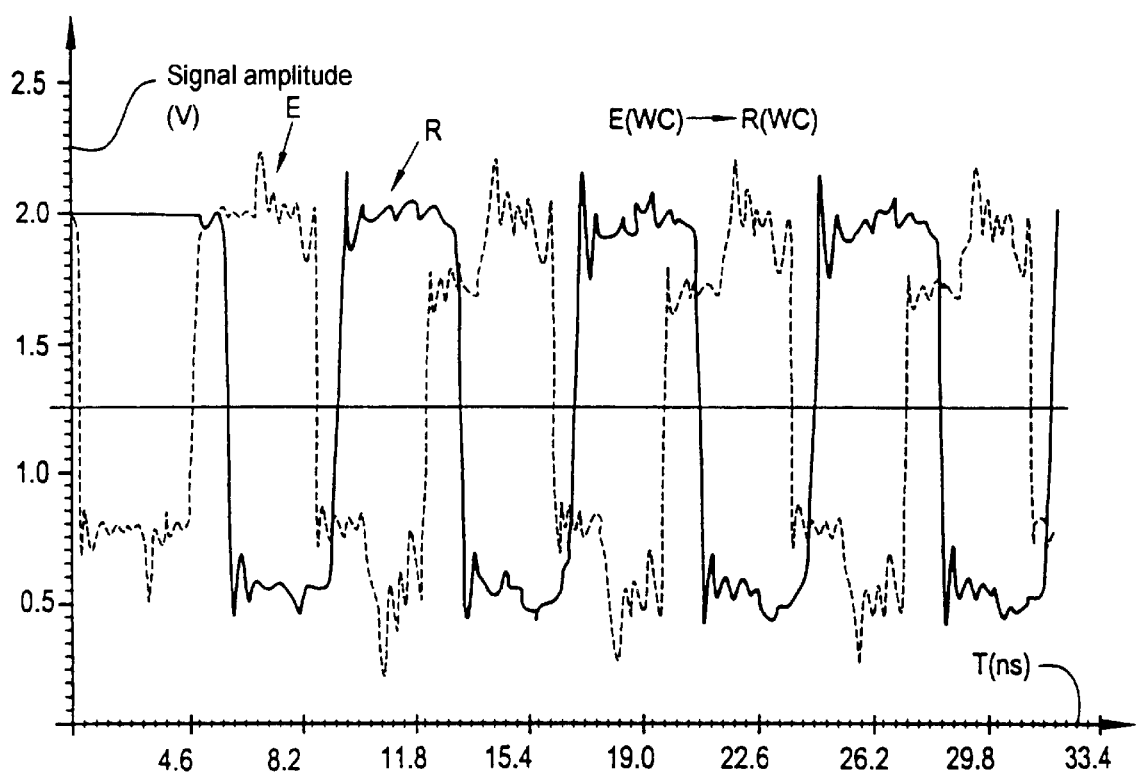
FIG. 13 shows the response of a buffer in FIG. 7, configured as a transmitter WC and a receiver WC, to a pulse train in a reality.

FIG. 13 illustrates case c) where the transmitter is WC and the receiver is WC.

Figure 14:
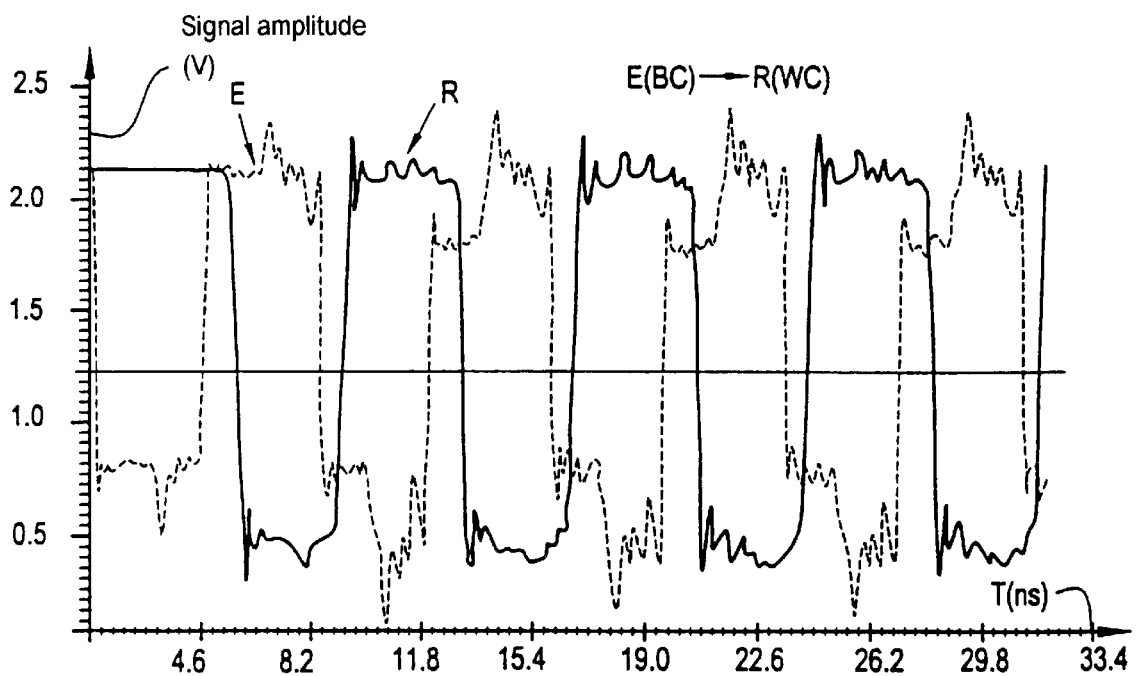
FIG. 14 shows the response of a buffer in FIG. 7, configured as a transmitter BC and a receiver WC, to a pulse train in a reality.

FIG. 14 illustrates case b) where the transmitter is BC and the receiver is WC.

Figure 15:
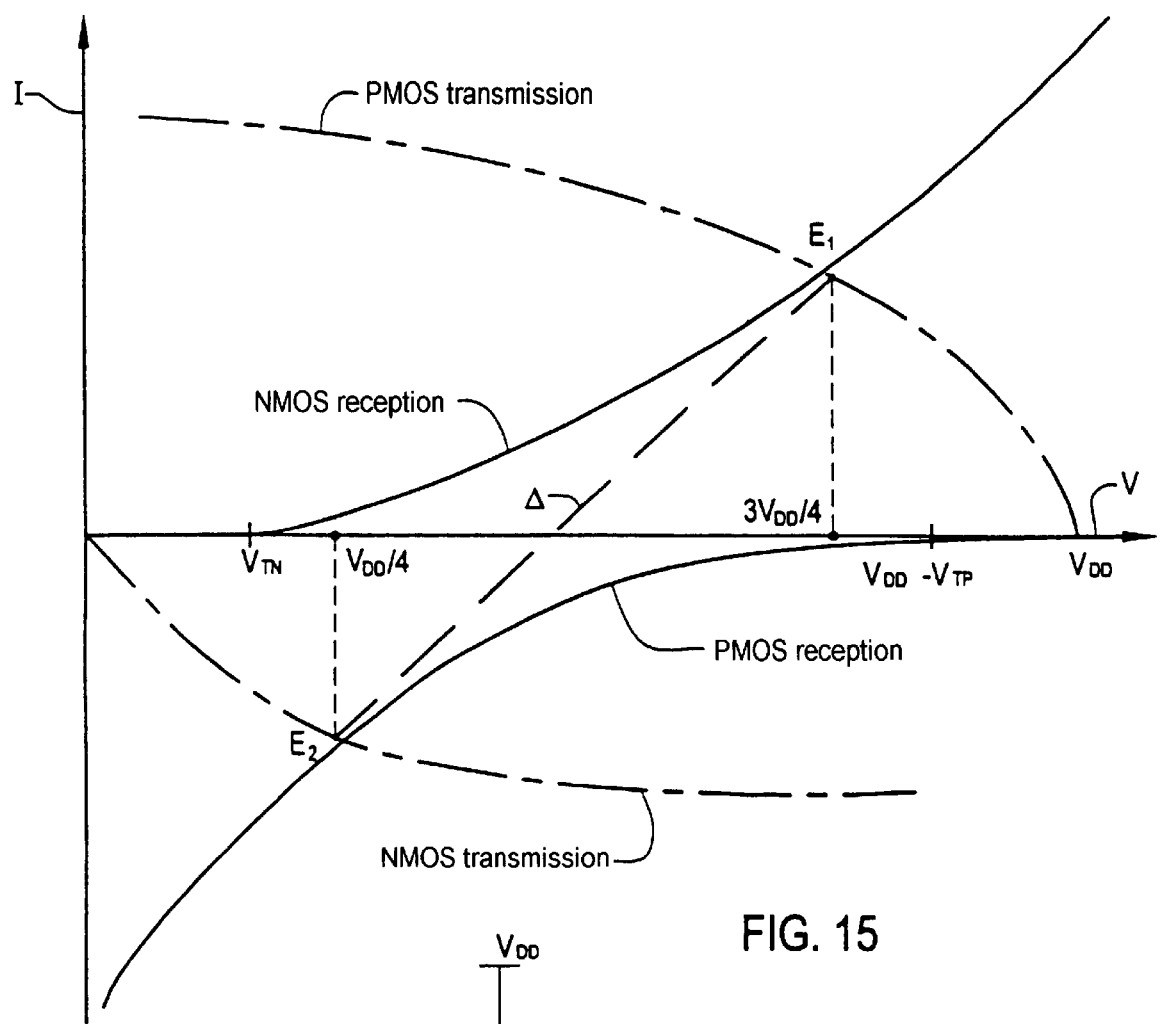
FIG. 15 is the electrical diagram of MOS adaptation transistors connected as adaptation resistors.
Figure 16:
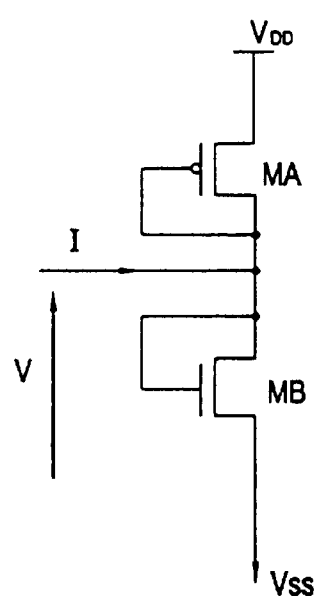
FIG. 16 is a diagram showing the graphic resolution of the dimensioning of the MOS adaptation transistors.

Finally, FIG. 15 shows the diagram, for transmission and for reception, of the current I as a function of the voltage V of the NMOS and PMOS transistors, arranged as adaptation resistors whose circuit diagram is shown in FIG. 16.

The diagram of FIG. 15 illustrates the dimensioning of the NMOS and PMOS transistors in the form of a graph.

The characteristics of the NMOS and the PMOS transistors in the reception mode have been shown in solid lines here, and the characteristics of the NMOS and the PMOS transistors in the transmission mode have been shown in dot-dashed lines.

As described above, the resistors RA and RB must each have the theoretical value 2ZC.

This is theoretically true, if the characteristics of the resistors RA and RB are linear. In reality, they are not. The algebraic sum of the characteristics, conversely, is quasi-linear.

The straight line Δ has a slope equal to the characteristic impedance ZC=50 ohms. The NMOS and PMOS transistors are dimensioned and paired or matched such that the algebraic sum of their reception characteristics coincide with the straight line Δ, and that their transmission characteristics intersect the straight line Δ at the respective points E1 and E2, called points of repose, for which the NMOS and PMOS transistors each output the same current and have the same voltage applied, which is VDD/4 for E2 and 3VDD/4 for E1 in the drawing.

The reception characteristic of the NMOS transistor is tangent to the axis of the abscissa at the point VTN, which corresponds to the threshold voltage of the NMOS transistor, and the transmission reception characteristic of the PMOS transistor is tangent to the axis of the abscissa at the point VDD-VTP, which corresponds to the threshold voltage of the PMOS transistor.

The dimensioning of the NMOS and PMOS transistors thus leads to positioning the points of repose on the straight line Δ, as a function of the level of the supply voltages.

The fact that the characteristics of each resistor RA and RB describe curves which are parabolic rather than linear in nature is more an advantage than not, in the sense that they allow adjustments of the points of repose E1 and E2 by means of sizes that are practically independent of the sizes of the NMOS and PMOS reception transistors.

The tailoring is perfect if the straight line Δ that connects the points E1 and E2 has a slope ΔV/ΔI equal to ZC.

While this invention has been described in conjunction with specific embodiments thereof, it is evident that many alternatives, modifications and variations will be apparent to those skilled in the art. Accordingly, the preferred embodiments of the invention as set forth herein, are intended to be illustrative, not limiting. Various changes may be made without departing from the spirit and scope of the invention as set forth herein and defined in the claims.

What is claimed is:

1. A bidirectional two-way CMOS link of the type including a transmission line (AB) adapted for connecting two integrated circuits respectively to its two ends, these circuits respectively including a transceiver (11) that has a transmitter stage (7; 20) and a receiver stage (10), by interface with the transmission line (AB) and controlled to transmit or receive digital data exchanged over the transmission line (AB) as a function of a control signal (transmission_gd) to put the transceiver in either the transmission mode or the reception mode, the transceiver never being in the same mode at the same time, characterized in that the transceiver includes at least one PMOS transistor (MA), and one NMOS transistor (MB), which are dimensioned, arranged and controlled in phase opposition with the control signal so as to behave like adaptation resistors (RA and RB) that adapt the link (AB) to the two ends of the transmission line (AB).

2. The link according to claim 1, characterized in that the adaptation resistors (RA and RB) have parabolic characteristics, and that their algebraic sum defines a quasi-linear characteristic (Δ), whose slope Δ(V)/Δ(I) is substantially equal to the characteristic impedance value (ZC) of the transmission line (AB).

3. The link according to claim 1, characterized in that the transmitter stage (7) of the transceiver (11) is a tristate amplifier having an input and an output and which receives the data to be transmitted and the control signal, and that the PMOS transistor (MA) and NMOS transistor (MB) are connected to the output of the tristate amplifier and to the input of the receiver stage (10) of the transceiver (11), the NMOS transistor (MB) being controlled, via a first commutation stage (13), by the control signal that validates either the transmission mode or the reception mode, and the PMOS transistor (MA) being controlled, via a second commutation stage (12), by the same control signal, inverted.

4. The link according to claim 2, characterized in that the transmitter stage (7) of the transceiver (11) is a tristate amplifier having an input and an output and which receives the data to be transmitted and the control signal, and that the PMOS transistor (MA) and NMOS transistor (MB) are connected to the output of the tristate amplifier and to the input of the receiver stage (10) of the transceiver (11), the NMOS transistor (MB) being controlled, via a first commutation stage (13), by the control signal that validates either the transmission mode or the reception mode, and the PMOS transistor (MA) being controlled, via a second commutation stage (12), by the same control signal, inverted.

5. The link according to claim 3, characterized in that the first commutation stage (13) behaves like two complementary switches ($13_1$ and $13_2$) in series with one another and with a low supply potential VSS and the output of the tristate amplifier (7), switches $13_1$ and $13_2$ having a junction coupled to a gate electrode (GB) of the NMOS transistor (MB) and said junction connecting the gate electrode either to the low supply potential for transmission, in which case the NMOS transistor (MB) is then off, or to a high supply potential VDD for reception, the NMOS transistor (MB) behaving like an adaptation resistor (RB), and that the second commutation stage (12) behaves like two complimentary switches ($12_1$ and $12_2$) in series with one another and with the high supply potential VDD and the output of the tristate amplifier (7), the two switches ($12_1$ and $12_2$) having a junction coupled to a gate electrode (GA) of the PMOS transistor (MA) and connecting the gate electrode (GA) to either the high supply potential for transmission, in which case the PMOS transistor (MA) is then off, or to the low supply potential VSS, in which case the PMOS transistor (MA) behaves like an adaptation resistor (RA).

6. The link according to claim 4, characterized in that the first commutation stage (13) behaves like two complementary switches ($13_1$ and $13_2$) in series with one another and with a low supply potential VSS and the output of the tristate amplifier (7), switches $13_1$ and $13_2$ having a junction coupled to a gate electrode (GB) of the NMOS transistor (MB) and said junction connecting the gate electrode either to the low supply potential for transmission, in which case the NMOS transistor (MB) is then off, or to a high supply potential VDD for reception, the NMOS transistor (MB) behaving like an adaptation resistor (RB), and that the second commutation stage (12) behaves like two complimentary switches ($12_1$ and $12_2$) in series with one another and with the high supply potential VDD and the output of the tristate amplifier (7), the two switches ($12_1$ and $12_2$) having a junction coupled to a gate electrode (GA) of the PMOS transistor (MA) and connecting the gate electrode (GA) to either the high supply potential for transmission, in which case the PMOS transistor (MA) is then off, or to the low supply potential VSS, in which case the PMOS transistor (MA) behaves like an adaptation resistor (RA).

7. The link according to claim 1, characterized in that a first transmitter stage (20) includes an amplifier (19) having an input and an output that receives the data to be transmitted (datain) at the input; a first commutation stage (15), coupled in series to an output of the amplifier (19) and controlled by the control signal; and a second commutation stage (16), coupled in series to the output of the first commutation stage (15) and controlled by the inverse of the control signal; and that the PMOS transistor (MA) and NMOS transistor (MB) are connected to the output of the commutation stages (15 and 16) and to an input of the receiver stage (10), the transistors (MA and MB) having shared gate electrodes (GA and GB) coupled on the one hand to the output of the amplifier, via the first commutation stage 15, and on the other hand to the drains of the PMOS and NMOS transistors, via the second commutation stage (16).

8. The link according to claim 2, characterized in that a first transmitter stage (20) includes an amplifier (19) having an input and an output that receives the data to be transmitted (datain) at the input; a first commutation stage (15), coupled in series to an output of the amplifier (19) and controlled by the control signal; and a second commutation stage (16), coupled in series to the output of the first commutation stage (15) and controlled by the inverse of the control signal; and that the PMOS transistor (MA) and NMOS transistor (MB) are connected to the output of the commutation stages (15 and 16) and to an input of the receiver stage (10), the transistors (MA and MB) having shared gate electrodes (GA and GB) coupled on the one hand to the output of the amplifier, via the first commutation stage 15, and on the other hand to the drains of the PMOS and NMOS transistors, via the second commutation stage (16).

9. The link according to claim 7, characterized in that the first and second commutation stages (15 and 16) are complimentary switches which, in transmission, respectively connect the gate electrodes (GA and GB) of the PMOS and NMOS transistors (MA and MB) to the output of the amplifier (19) and disconnect the gate electrodes (GA and GB) of the drains ($D_{A, B}$) of the PMOS and NMOS transistors (MA and MB), the PMOS and NMOS transistors (MA and MB) behaving like a CMOS amplifier, and respectively, for reception, connect the drains ($D_{A, B}$) to the gate electrodes (GA and GB) and disconnect the gate electrodes (GA and GB) from the output of the amplifier (19), the PMOS and NMOS transistors (MA and MB) behaving respectively like resistors (RA and RB).

10. The link according to claim 8, characterized in that the first and second commutation stages (15 and 16) are complimentary switches which, in transmission, respectively connect the gate electrodes (GA and GB) of the PMOS and NMOS transistors (MA and MB) to the output of the amplifier (19) and disconnect the gate electrodes (GA and GB) of the drains ($D_{A, B}$) of the PMOS and NMOS transistors (MA and MB), the PMOS and NMOS transistors (MA and MB) behaving like a CMOS amplifier, and respectively, for reception, connect the drains ($D_{A, B}$) to the gate electrodes (GA and GB) and disconnect the gate electrodes (GA and GB) from the output of the amplifier (19), the PMOS and NMOS transistors (MA and MB) behaving respectively like resistors (RA and RB).

11. The link according to claim 7, characterized in that the commutation stages (15 and 16) each include an PMOS transistor (18) and an NMOS transistor (17) connected in parallel, and each having gate electrodes connected to receive the control signal and a complimentary control signal, respectively, and input/output data terminals that correspond respectively to a junction of the PMOS and NMOS transistors (17 and 18).

12. The link according to claim 7, characterized in that the dimensions of the PMOS and NMOS transistors (MA and MB) used for the adaptation are substantially on the same order of magnitude as the dimensions of MOS transistors used for the transmission and reception of data.

13. The link according to claim 9, characterized in that the dimensions of the PMOS and NMOS transistors (MA and MB) used for the adaptation are substantially on the same order of magnitude as the dimensions of MOS transistors used for the transmission and reception of data.

14. The link according to claim 11, characterized in that the dimensions of the PMOS and NMOS transistors (MA and MB) used for the adaptation are substantially on the same order of magnitude as the dimensions of MOS transistors used for the transmission and reception of data.

15. The link according to claim 7, characterized in that it further includes a second transmitter stage (21), connected in parallel with the first transmitter stage (20) and receiving the data to be transmitted (datain) at a first input and the control signal (transmission_gd) at a second input, and including MOS transistors arranged in dimensions to adjust the value of the equivalent resistance in transmission of the link, regardless of its equivalent resistance in reception.

16. The link according to claim 9, characterized in that it further includes a second transmitter stage (21), connected in parallel with the first transmitter stage (20) and receiving the data to be transmitted (datain) at a first input and the control signal (transmission_gd) at a second input, and including MOS transistors arranged in dimensions to adjust the value of the equivalent resistance in transmission of the link, regardless of its equivalent resistance in reception.

17. The link according to claim 11, characterized in that it further includes a second transmitter stage (21), connected in parallel with the first transmitter stage (20) and receiving the data to be transmitted (datain) at a first input and the control signal (transmission_gd) at a second input, and including MOS transistors arranged in dimensions to adjust the value of the equivalent resistance in transmission of the link, regardless of its equivalent resistance in reception.

18. The link according to claim 11, characterized in that it further includes at least one receiver stage (22) coupled to an output of the transceiver (10, 20) and controlled at an input by a reception control signal (reception_bi), and including MOS transistors arranged and dimensioned to furnish a conductance complement for reception independently of the transmission.

19. The link according to claim 15, characterized in that it further includes at least one third transmitter stage (23) connected in parallel to the first and second transmitter stages (20 and 21) and having a first input for receiving the data (datain) to be transmitted and a second input for receiving a second transmission control signal (transmission_gd_bi) independent of the first, and including MOS transistors arranged and dimensioned for refining the adjustment of the equivalent resistance for transmission independently of the reception.

20. The link according to claim 15, characterized in that it further includes a receiver stage (22) coupled to an output of the transceiver (10, 20) and controlled at an input by a reception control signal (reception_bi) and that it further includes at least a second transmitter stage (23) and a third transmitter stage (24), connected respectively in parallel to the first transmitter stage (20) and having first inputs respectively receiving the data (datain) to be transmitted and second inputs respectively receiving a second transmission control signal (transmission_gd_bi[1]) and a third transmission control signal (transmission_gd_bi[1]) and including MOS transistors arranged and dimensioned for refining the adjustment of the equivalent resistance for transmission independently of the reception.

* * * * *